United States Patent
Okada (10) Patent No.: US 9,754,685 B2
(45) Date of Patent: Sep. 5, 2017

(54) MEMORY CONTROL DEVICE AND MEMORY CONTROL METHOD

(71) Applicant: LAPIS Semiconductor Co., Ltd., Yokohama (JP)

(72) Inventor: Toshiharu Okada, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 55 days.

(21) Appl. No.: 14/829,634

(22) Filed: Aug. 18, 2015

(65) Prior Publication Data

US 2016/0054924 A1 Feb. 25, 2016

(30) Foreign Application Priority Data

Aug. 19, 2014 (JP) .................................. 2014-166937

(51) Int. Cl.

| G06F 3/06 | (2006.01) |
|---|---|
| G11C 29/52 | (2006.01) |
| G06F 11/10 | (2006.01) |
| G11C 7/20 | (2006.01) |
| G11C 29/04 | (2006.01) |

(52) U.S. Cl.
CPC .......... *G11C 29/52* (2013.01); *G06F 11/1048* (2013.01); *G11C 7/20* (2013.01); *G11C 2029/0407* (2013.01); *G11C 2029/0411* (2013.01)

(58) Field of Classification Search
CPC .... G06F 3/0604; G06F 3/0632; G06F 3/0653; G06F 3/0679; G06F 11/1068; G11C 29/52
See application file for complete search history.

(56) References Cited

U.S. PATENT DOCUMENTS

| 5,530,673 A * | 6/1996 | Tobita ................... G06F 3/0601 |
| | | 365/185.04 |
| 6,078,520 A * | 6/2000 | Tobita ................. G06F 11/1433 |
| | | 365/185.09 |
| 2006/0053246 A1* | 3/2006 | Lee ....................... G06F 9/4403 |
| | | 711/100 |
| 2014/0223098 A1* | 8/2014 | Lee ....................... G06F 9/5016 |
| | | 711/118 |

FOREIGN PATENT DOCUMENTS

JP  2011-128751 A  6/2011

* cited by examiner

*Primary Examiner* — Phung M Chung
(74) *Attorney, Agent, or Firm* — Rabin & Berdo, P.C.

(57) ABSTRACT

A memory device is operative to reset write-in status or read-out status information data in accordance with a reset signal. In response to the reset signal, a memory control device refers to a power-on reset check region in a RAM and determines whether or not the received reset signal is a power-on reset signal that is the reset signal generated firstly after power on. If the reset signal is determined to be the power-on reset signal, a memory check process is executed on respective target pages in each block in the memory. A refresh process is also performed on a block in which the number of error bits detected in the memory check process is more than a threshold value. The memory check process is performed on a different page whenever power is supplied.

10 Claims, 9 Drawing Sheets

MEMORY CONTROL DEVICE AND MEMORY CONTROL METHOD

BACKGROUND OF THE INVENTION

1. Field of the Invention

The present invention relates to a memory control device and a memory control method for performing data access to a memory.

2. Description of the Related Art

In recent years, with an increase in memory capacity, NAND flash memories excellent in a bit unit price are widely used. In the NAND flash memories with increased memory capacity and high integration, problems such as aging degradation of written data and incorrect data read due to concentrated reading operation have become obvious. These problems occur when electric charges that hold data are reduced with a lapse of years and/or when saved data are destroyed by a small amount of charges accumulated in adjacent memory cells through read operation.

To avoid such failures, a process of correcting an error portion of data is performed by adding an error correcting code (ECC), which corrects a data error, to the data, and writing and reading the data together with the ECC. However, the number of bits correctable by using the correcting code is limited. When the number of error bits is more than the correctable limit, error correction is no longer effective. This makes it necessary to detect and correct an error before the number of error bits exceeds the correctable limit. Accordingly, an apparatus has been devised to implement a method for detecting an error before the number of error bits exceeds the correctable limit (for example, Japanese Patent Application Laid-Open No. 2011-128751). In this apparatus, memory check is performed when normal data read is not performed so as to determine whether or not a refresh process is necessary.

In this apparatus, memory check is performed at the time of standby of a memory (at the time of idling) to determine a region that needs a refresh process. However, even if the memory is in a standby state at the time of starting memory check, data read may be requested in the midst of the memory check process thereafter. In such a case, a data read process needs to be performed after the memory check process is completed, which disturbs memory operation, causing such a problem as delayed data read process.

SUMMARY OF THE INVENTION

The present invention has been devised to solve the above problems, and an object of the present invention is to provide a memory control device and a memory control method capable of performing an error check process and a refresh process of a memory without disturbing memory operation.

A memory control device according to the present invention is a memory control device that controls either write-in or read-out operation for a memory, including: an interface unit connected to the memory for performing either write-in or read-out operation for the memory; a power-on reset signal generation unit for generating a power-on reset signal in response to power on; an internal reset signal generation unit for generating an internal reset signal in response to a reset request; an initializing signal supply unit for delivering the power-on reset signal or the internal reset signal as an initializing signal that initializes write-in status or read-out status information data held by the interface unit to the interface unit; and a control unit for determining whether or not the initializing signal is based on the power-on reset signal after the write-in status or read-out status information data in the interface unit is initialized in response to the initializing signal, and for performing a check process on the memory if the initializing signal is determined to be based on the power-on reset signal.

A memory control method according to the present invention is a memory control method for controlling either write-in or read-out operation for a memory, including the steps of: generating a power-on reset signal in response to power on; generating an internal reset signal in response to a reset request; delivering the power-on reset signal or the internal reset signal as an initializing signal; and determining whether or not the initializing signal is based on the power-on reset signal and performing a check process on the memory only when the initializing signal is determined to be based on the power-on reset signal.

In the present invention, when a reset signal is received, it is determined whether or not the reset signal is a power-on reset signal. Only when the power-on reset signal is received, the memory check process and the refresh process are performed.

As a consequence, when a flash memory is accessed after power is supplied, the apparatus is free from a standby state for the memory check process and the refresh process, so that a rapid access to the flash memory can be performed constantly. Therefore, according to the present invention, the error check process and the refresh process of the memory can be performed without disturbing memory operation.

DETAILED DESCRIPTION OF THE INVENTION

Hereinbelow, embodiments of the present invention will be described in detail with reference to the accompanying drawings.

First Embodiment

Figure 1:
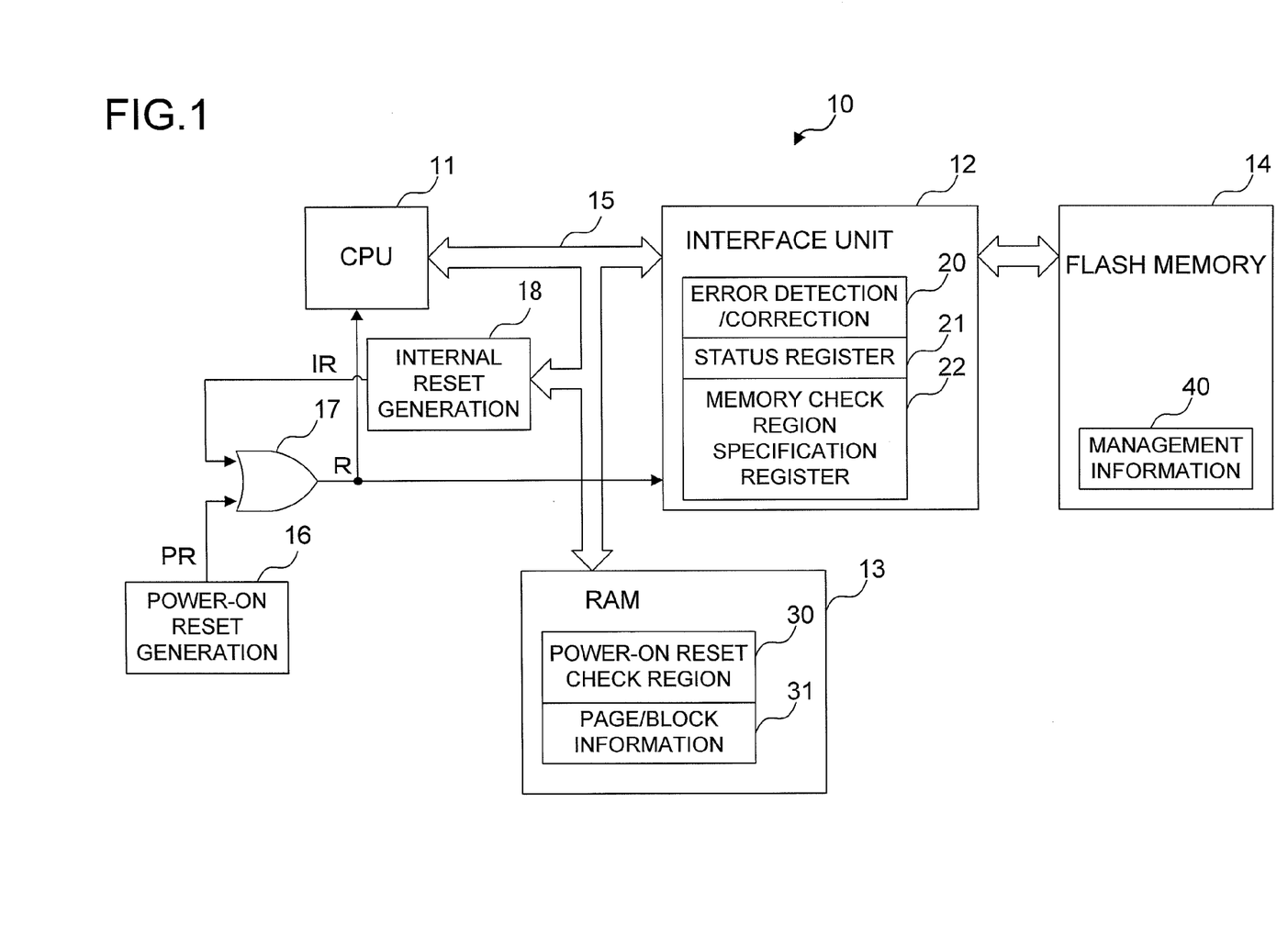
FIG. 1 is a block diagram illustrating a configuration of an information processing apparatus according to the present invention.

FIG. 1 is a block diagram illustrating the configuration of an information processing apparatus 10 including a memory control device according to the present invention. As illustrated in FIG. 1, the information processing apparatus 10 includes a central processing unit (CPU) 11, an interface unit 12, a random access memory (RAM) 13, a flash memory 14, a CPU bus 15, a power-on reset generation unit 16, an OR gate 17, and an internal reset generation unit 18.

The CPU 11 is connected to the interface unit 12, the RAM 13, and the internal reset generation unit 18 through the CPU bus 15. The CPU 11 performs data read and write access to the flash memory 14 through the CPU bus 15 and the interface unit 12.

The CPU 11 is a control unit for reading program data stored in the flash memory 14, which is a main program for implementing a main function of the information processing apparatus 10, through the interface unit 12, and for executing main control in accordance with the main program. The CPU 11 further reads memory check program data stored in the flash memory 14 through the interface unit 12, and executes memory check process in accordance with the memory check program data. The memory check process is to check whether or not the data stored in the flash memory 14 can correctly be read. The details of the memory check process will be described later.

The interface unit 12 includes an error detection/correction unit 20, a status register 21, and a memory check region specification register 22. The error detection/correction unit 20 detects an error included in a page to be checked (hereinafter referred to as an offset page) in a later-described memory check process target block. The error detection/correction unit 20 corrects an error in a specified block. The status register 21 holds information, including the number of error bits detected by the error detection/correction unit 20. The memory check region specification register 22 holds information indicative of a memory region specified as a target of the memory check process. The interface unit 12 has control information such as write-in status or read-out status information data to the flash memory 14. Such control information held by the interface unit 12 is reset (initialized) in response to a reset signal R.

Figure 2A:
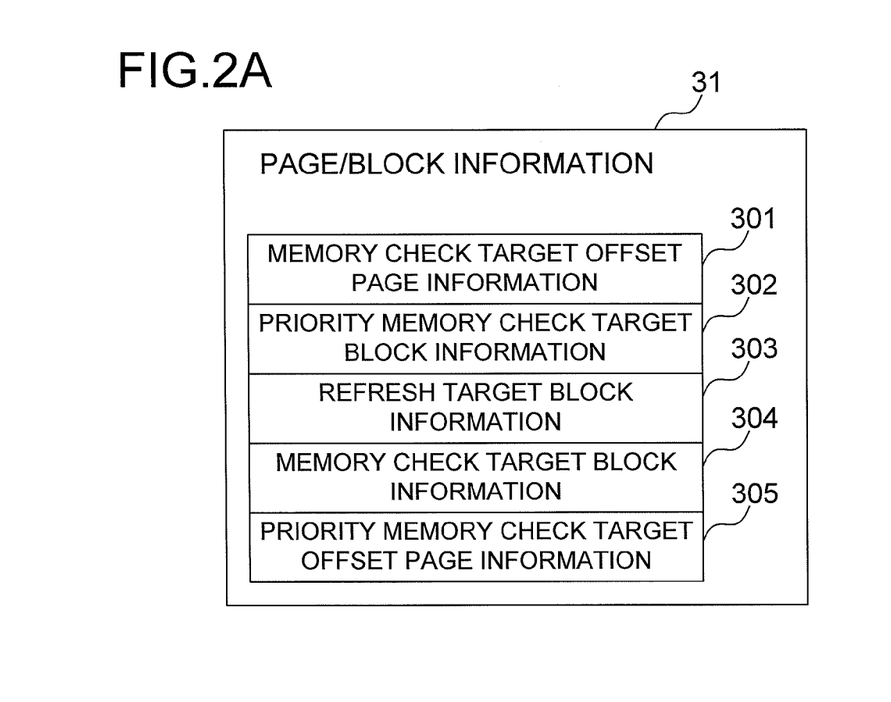
FIGS. 2A and 2B illustrate information included in page/block information and management information.

The RAM 13 includes a power-on reset check region 30 as a storage unit. For example, a one-byte value "Ox5A" (power-on-reset code) is written to the power-on reset check region 30 by the CPU 11 as information indicative of the reception of a power-on reset signal PR that is the power-on reset signal after power is supplied to the information processing apparatus 10. Once the value "Ox5A" is written, the power-on reset check region 30 holds the value "Ox5A" until the information processing apparatus 10 is turned off. The page/block information 31 is stored in the RAM 13. As illustrated in FIG. 2A, the page/block information 31 includes memory check target offset page information 301, priority memory check target block information 302, refresh target block information 303, memory check target block information 304, and priority memory check target offset page information 305.

Figure 2B:
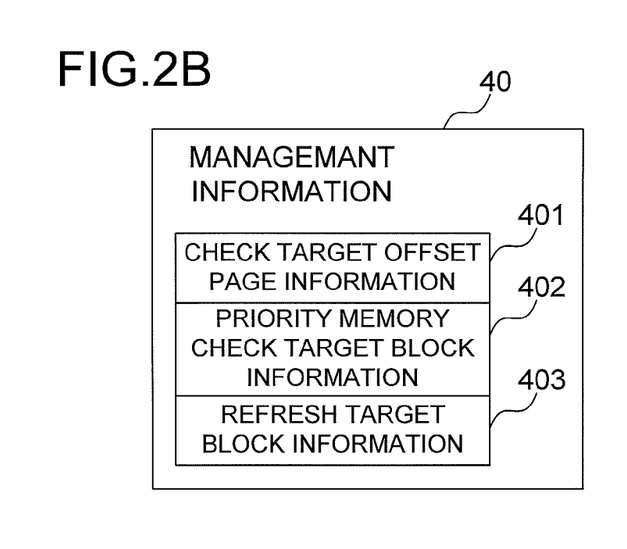
Figure 3A:
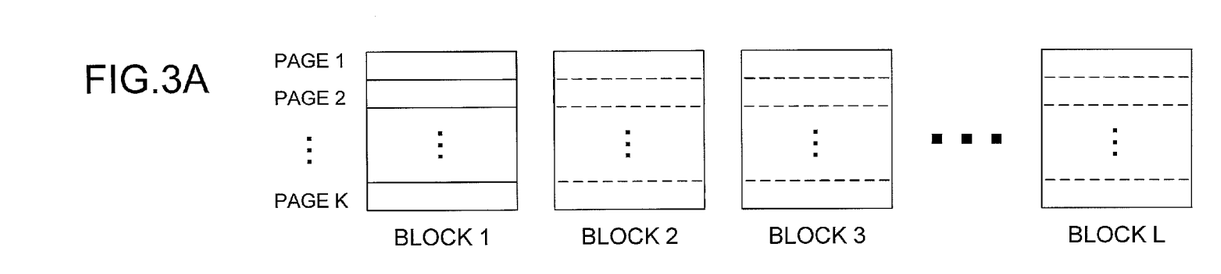
FIGS. 3A to 3C are schematic views illustrating a plurality of blocks and pages which constitute a flash memory.

As illustrated in FIG. 3A, the flash memory 14 is divided into access regions of L blocks 1 to L (L is a natural number), with one block including K pages 1 to K (K is a natural number). The flash memory 14 has a region for storing management information 40. As illustrated in FIG. 2B, the management information 40 includes check target offset page information 401, priority memory check target block information 402, and refresh target block information 403.

The power-on reset generation unit 16 generates a one-pulse reset signal PR (power-on reset signal) when power is supplied to the information processing apparatus 10, and supplies the signal to the OR gate 17. The internal reset generation unit 18 generates a one-pulse reset signal (internal reset signal) in response to a reset request command issued at the time of execution of main control or a timeout error by a program timer (not illustrated), and supplies the signal to the OR gate 17. When the reset signal PR is supplied from the power-on reset generation unit 16, the OR gate 17 supplies the signal as a reset signal R (initializing signal) to the CPU 11 and the interface unit 12. When the reset signal IR is supplied from the internal reset generation unit 18, the OR gate 17 supplies the signal as a reset signal R to the CPU 11 and the interface unit 12.

Figure 4:
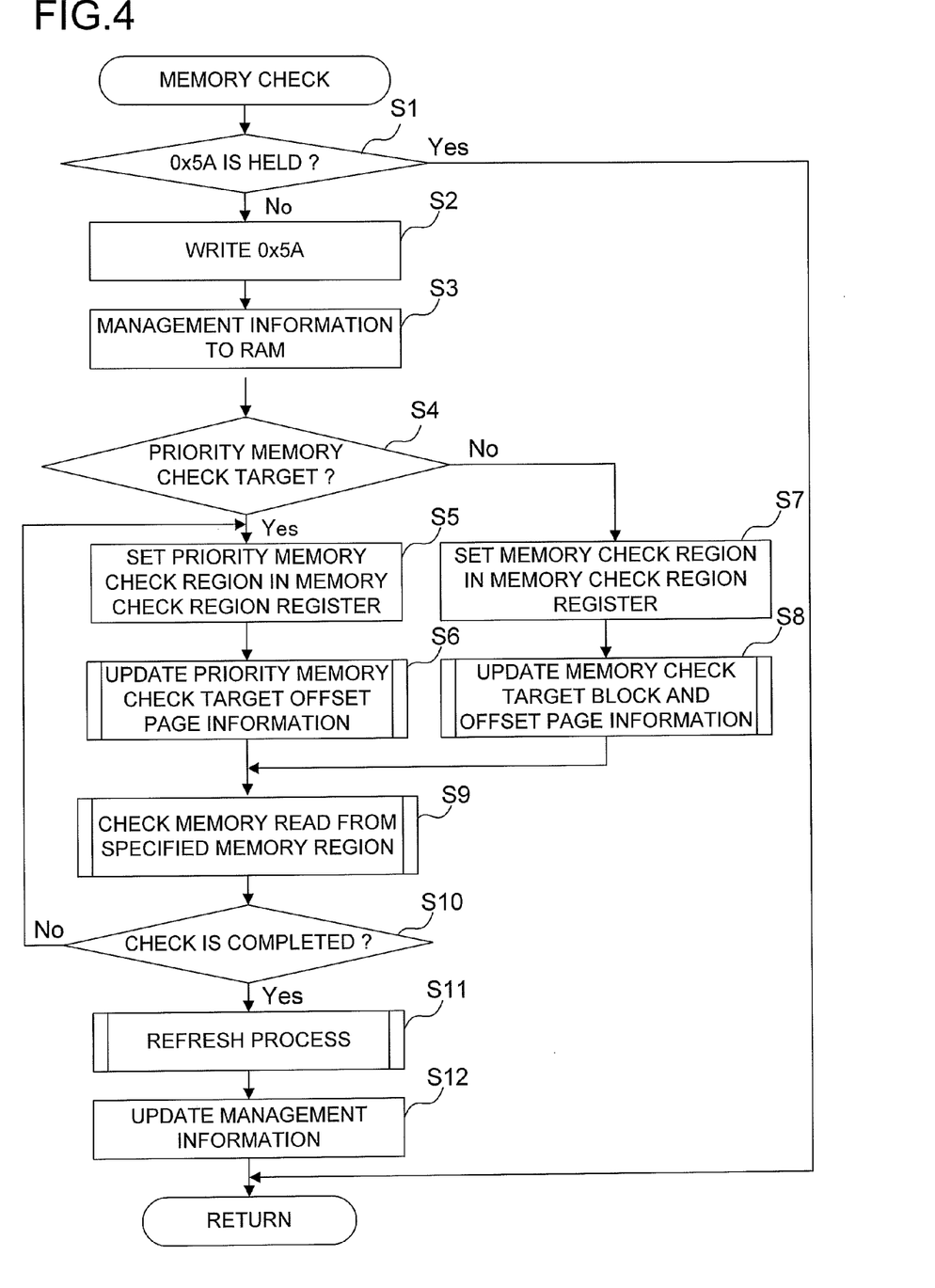
FIG. 4 is a flow chart illustrating memory check routine.

The CPU 11 executes the above-stated memory check process in accordance with the memory check routine illustrated in FIG. 4 in response to the reset signal R.

First, the CPU 11 determines whether or not a value held in the power-on reset check region 30 of the RAM 13 is "Ox5A" (step S1). If it is determined in step S1 that the value held in the power-on reset check region 30 is "Ox5A," the CPU 11 determines that the received reset signal R is not based on the power-on reset signal PR, and ends the memory check routine. If it is determined that the value "Ox5A" is not held in the power-on reset check region 30 in step S1, the CPU 11 determines that the received reset signal R is based on the power-on reset signal PR, and writes "Ox5A" to the power-on reset check region 30 in the RAM 13 (step S2).

Next, the CPU 11 reads the management information 40 illustrated in FIG. 2B from the flash memory 14 through the interface unit 12, and writes the information to the RAM 13 as the page/block information 31 (step S3). As a consequence, the check target offset page information 401 in the management information 40 is stored in the RAM 13 as the memory check target offset page information 301. The priority memory check target block information 402 in the management information 40 is also stored in the RAM 13 as the priority memory check target block information 302. Furthermore, the refresh target block information 403 is stored in the RAM 13 as the refresh target block information 303.

The CPU 11 determines whether or not a target block (for example, a block 1) in the flash memory 14 is a priority memory check target block, on the basis of the priority memory check target block information 302 stored in the RAM 13 (step S4). The determination in step S4 is performed on all the blocks from the block 1 to block L through a later-described update process of memory check target block and offset page information.

If the target block is the priority memory check target block as a result of determination in step S4, the CPU 11 sets the block in the memory check region specification register 22 of the interface unit 12 as a priority memory check target region (step S5). After execution of step S5, the CPU 11 shifts to execution of an update process of a priority memory check target offset page (step S6).

Figure 5:
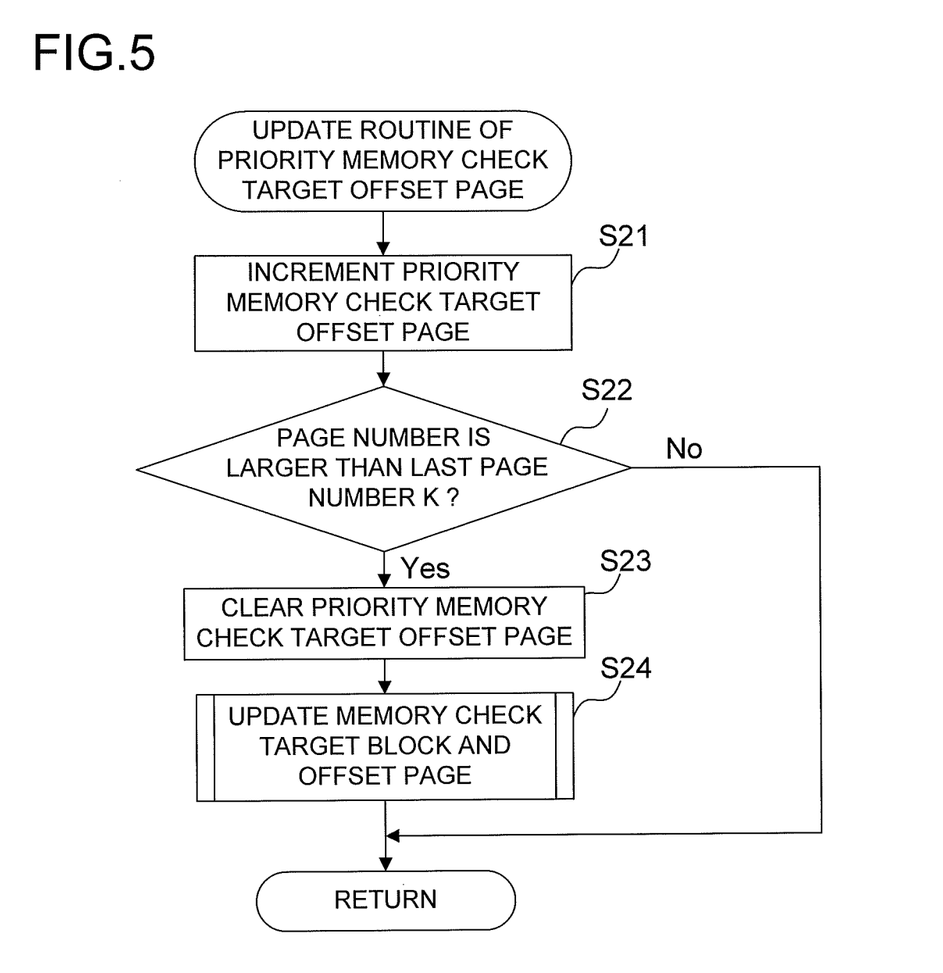
FIG. 5 is a flow chart illustrating an update routine of priority memory check target offset page.

FIG. 5 is a flow illustrating a routine of the update process of the priority memory check target offset page. In FIG. 5, the CPU 11 first increments the number indicated in the priority memory check target offset page information 305 stored in the RAM 13 by 1, and overwrites the incremented number in the priority memory check target offset page information 305 in the RAM 13 as a number representative of new priority memory check target offset page information (step S21). For example, when a page number "N" is stored, a page number "N+1" that is an increment of N by 1 is overwritten as a new page number. An initial value of the priority memory check target offset page is 1, which represents a first page. Next, the CPU 11 determines whether or not the incremented page number exceeds a last page number K (step S22). If it is determined that the page number exceeds the last page number K in step S22, i.e., when all the priority memory check processes within the priority memory check target block are finished, the priority memory check target offset page information 305 in the RAM 13 is cleared and initialized (step S23). After execution of step S23, the CPU 11 shifts to execution of the memory check target block and offset page update process (step S24).

Figure 6:
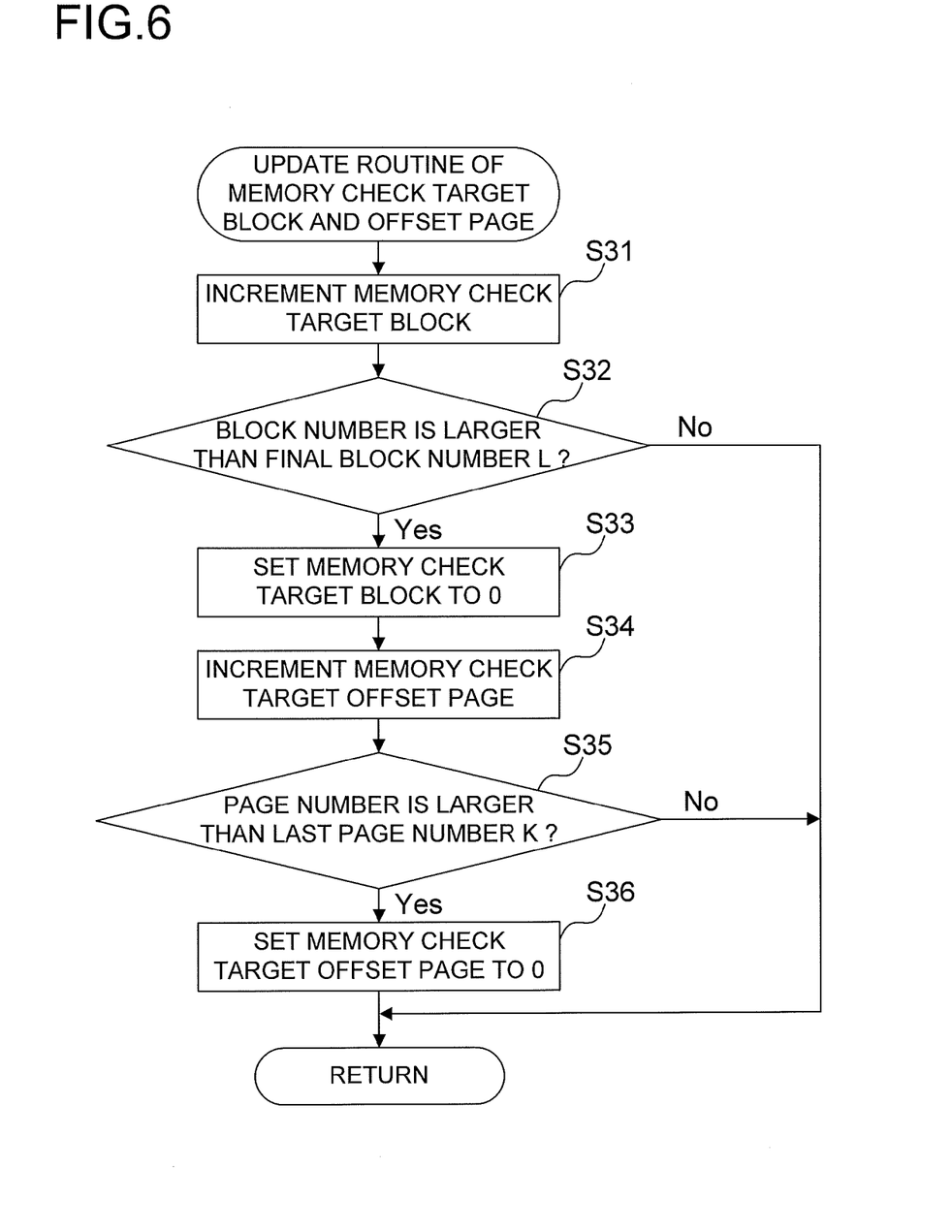
FIG. 6 is a flow chart illustrating an update routine of memory check target block and offset page.

FIG. 6 is a flow chart illustrating a routine of the memory check target block and offset page update process. The CPU 11 increments the number indicated by the memory check target block information 304 stored in the RAM 13 by 1, and overwrites the incremented number in the RAM 13 as a number representative of a new memory check target block (step S31). Next, the CPU 11 determines whether or not the incremented block number exceeds a final block number L (step S32). If it is determined in step 32 that the block number exceeds the final block number L, i.e., if a series of normal memory check processes are completed in the memory check target blocks, the CPU 11 rewrites the block number of the memory check target block information 304 stored in the RAM 13 to an initial number 0 (step S33). Next, the CPU 11 increments the number indicated by the memory check target offset page information 301 by 1 and overwrites the incremented number as a number representative of a new memory check target offset page in the RAM 13 (step S34). Then, the CPU 11 determines whether or not the incremented page number exceeds a last page number K (step S35). If it is determined that the page number exceeds the last page number K in step S35, i.e., if the normal memory check process is completed in all the pages in the memory check target block, the CPU 11 rewrites the page number of the memory check target offset page information 301 stored in the RAM 13 to an initial number 0 (step S36).

If it is determined that the block number does not exceeds the final block number L after execution of step S36 or in step S32, or if it is determined that the page number does not exceed the last page number K in step S35, the CPU 11 gets out of the memory check target block and offset page update routine illustrated in FIG. 6 and shifts to execution of step S9.

If it is determined that the target block is not a priority memory check target block in step S4 illustrated in FIG. 4, the CPU 11 sets the block in the memory check region specification register 22 of the interface unit 12 as a normal memory check target region (step S7). After execution of step S7, the CPU 11 shifts to execution of the update process of memory check target block and offset page information (step S8).

After execution of the update process of priority memory check target offset page information (step S6) illustrated in FIG. 4, or the update process of memory check target block and offset page information (step S8), the CPU 11 executes a process of checking memory read from a specified memory region (step S9).

In the memory read checking process, the CPU 11 specifies an address in the flash memory 14, and supplies a read command signal to the interface unit 12. In response to the read command signal, the interface unit 12 reads an encoded data piece stored in the page corresponding to the specified address from the flash memory 14. The error detection/correction unit 20 in the interface unit 12 executes an error detection process on the encoded data piece, and generates error information indicative of the number of error bits. The CPU 11 stores in the status register 21 of the interface unit 12 the error information in association with the number of the block in the flash memory 14, in which the error-detected encoded data piece is held.

Figure 3B:
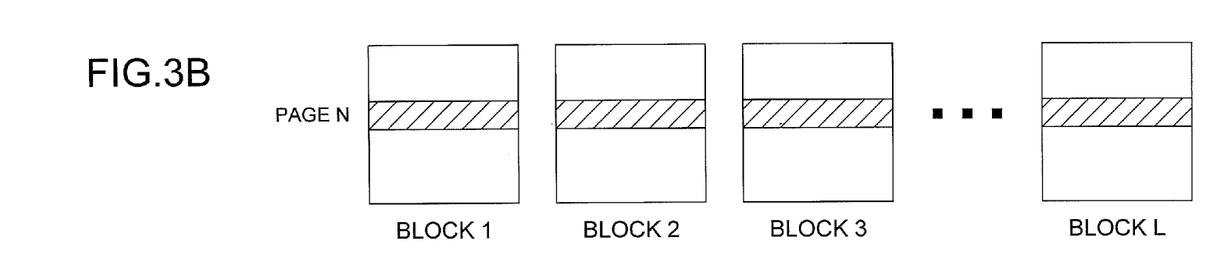

In the normal memory check process, error detection is performed while the block number is incremented. Accordingly, as illustrated in FIG. 3B, memory check is performed on the same pages of all the blocks in the order of, for example, a page N in the block 1, a page N in the block 2, and a page N in the block 3 . . . . When memory check is performed up to the final block, the offset page is incremented. Therefore, whenever power is supplied, the memory check process is performed on a different page.

Figure 3C:
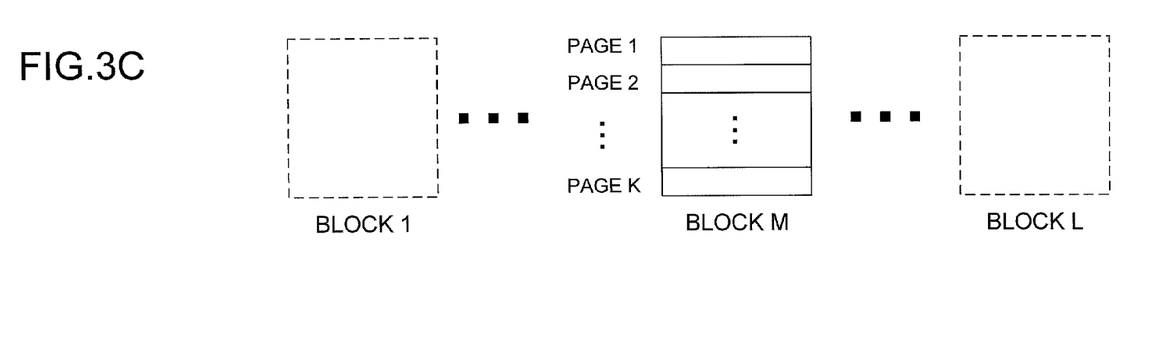

Contrary to this, in the priority memory check process, a priority memory check target block is checked while the number of pages in that block is incremented. Hence, as illustrated in FIG. 3C, memory check is performed on all the pages in a block M, for example.

Figure 7:
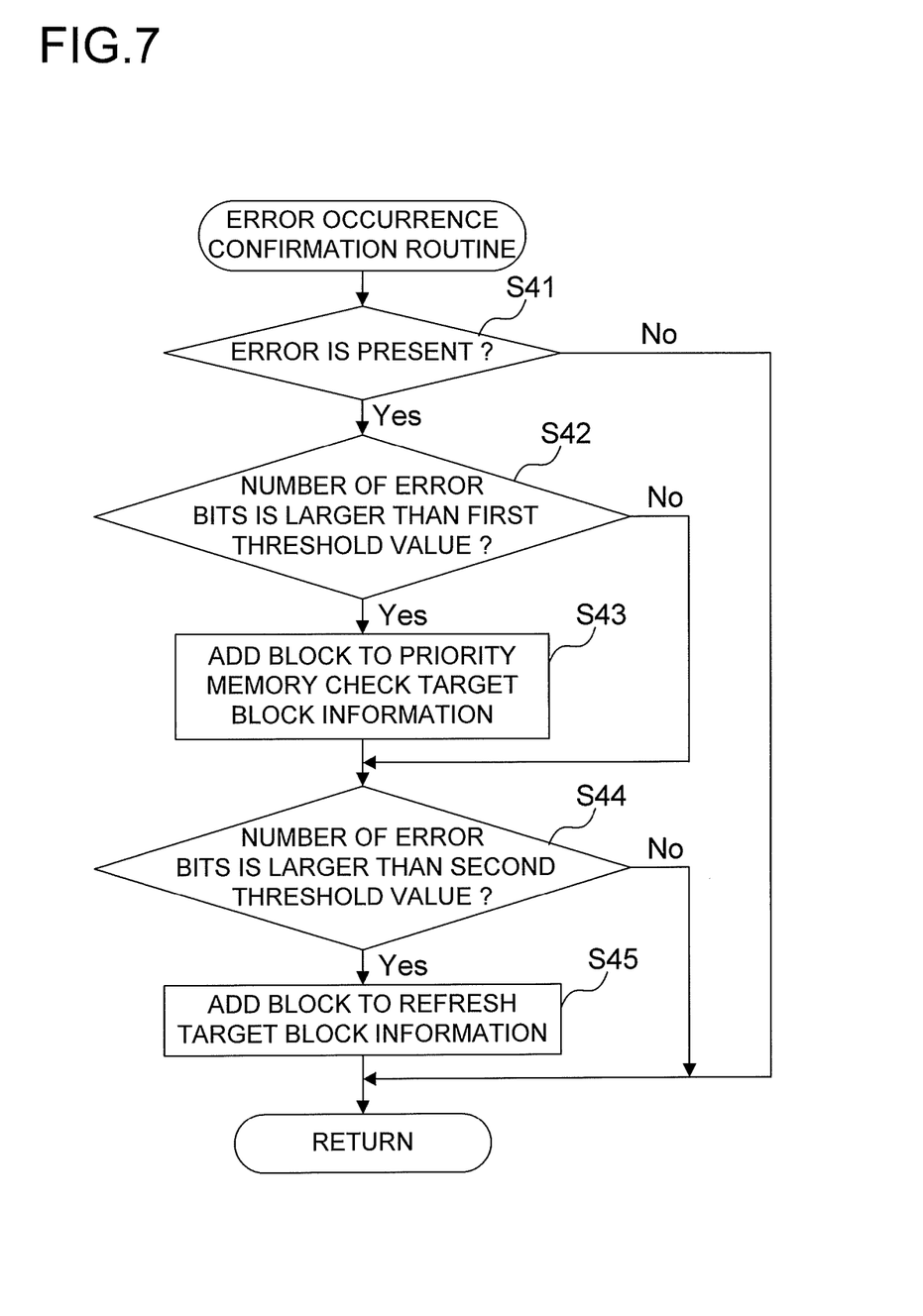
FIG. 7 is a flow chart illustrating an error occurrence confirmation routine.

The CPU 11 executes an error occurrence confirmation process as illustrated in FIG. 7 during the process of checking memory read from the specified memory region in step S9.

As illustrated in FIG. 7, the CPU 11 determines whether or not an error is present, i.e., whether or not the number of error bits is one or more, on the basis of the error information stored in the status register 21 (step S41). If it is determined that the error is not present, the CPU 11 ends the error occurrence confirmation process.

If it is determined that the error is present in step S41, the CPU 11 determines whether or not the number of error bits is larger than a first threshold value TE1, on the basis of the error information stored in the status register 21 (step S42). If it is determined that the number of error bits is larger than the first threshold value TE1, the CPU 11 adds the number of the pertinent block to the priority memory check target block information 302 in the RAM 13 (step S43). Then, the CPU 11 determines whether or not the number of error bits is larger than a second threshold value TE2 (TE2>TE1) (step S44). If it is determined that the number of error bits is larger than the second threshold value TE2, the CPU 11 adds the number of the pertinent block to the refresh target block information 303 in the RAM 13 (step S45).

After execution of step S45, or if it is determined that the number of error bits is less than the second threshold value TE2 in step S44, the CPU 11 ends the error occurrence confirmation routine.

After execution of the process of checking memory read from the specified memory region (step S9) including the error occurrence confirmation routine, the CPU 11 determines whether or not the memory read check is completed in all the blocks (step 10). If it is determined that the check is completed, the CPU 11 shifts to execution of the refresh process (step S11). If it is determined that the check is not completed, the CPU 11 returns to step S4 and re-executes the process of steps S4 to S9.

Figure 8:
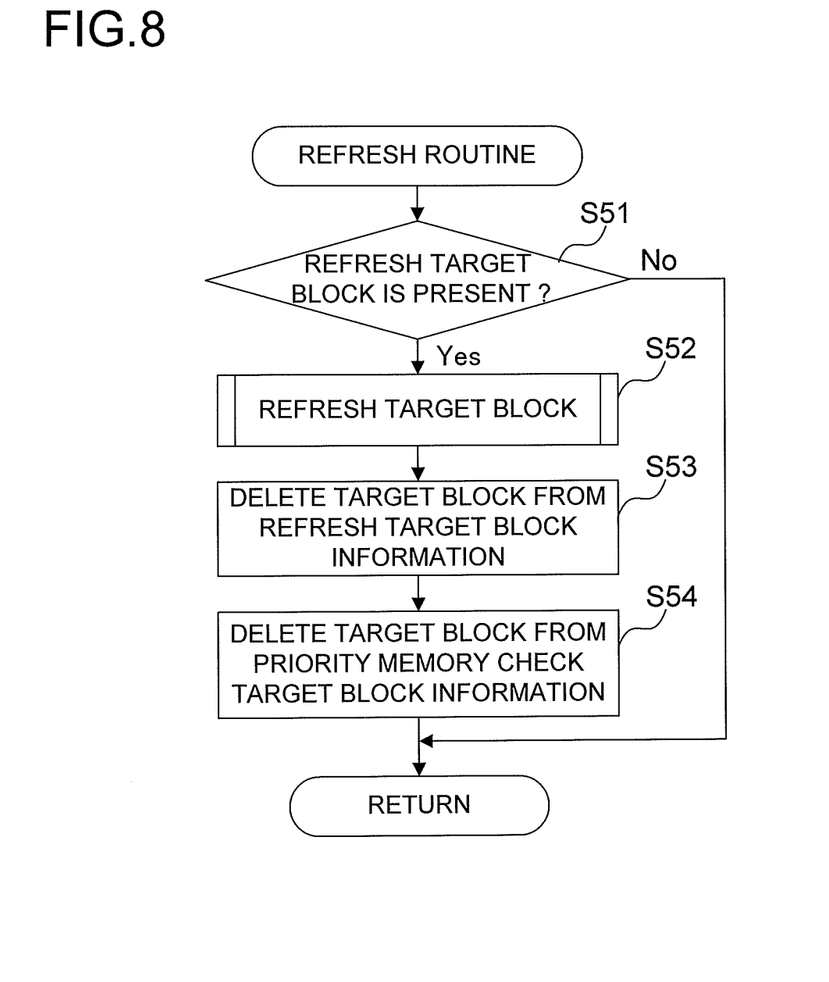
FIG. 8 is a flow chart illustrating a refresh routine.

FIG. 8 is a flow chart illustrating the refresh process routine.

The CPU 11 determines whether or not a refresh target block is present, on the basis of the refresh target block information 303 in the RAM 13 (step S51). When it is determined that the refresh target block is not present, the CPU 11 ends the refresh process.

If it is determined that the refresh target block is present, the CPU 11 sends out an execution command of the refresh process to the interface unit 12 (step S52).

In the refresh process, the interface unit 12 first reads an encoded data piece from the refresh process target block. The error detection/correction unit 20 of the interface unit 12 performs an error correction process on the encoded data piece. The interface unit 12 writes the encoded data piece of one block, on which the error correction process has been performed, to a block different from the block where the original encoded data piece was held.

The CPU 11 deletes the number of the block, on which the refresh process has been performed, from the refresh target block information 303 in the RAM 13 (step S53). The CPU 11 also deletes the number of the same block from the priority memory check target block information 302 in the RAM 13 (step S54).

As described in the foregoing, when a reset signal R is received in the above-stated memory check process, it is first determined whether or not the reset signal R is based on the power-on reset signal PR, on the basis of the value held in the power-on reset check region 30 of the RAM 13. In this case, only when the reset signal R based on the power-on reset signal is received, the memory check process and the refresh process are performed. That is, if the reset signal R based on an internal reset signal IR is received, the memory check process and the refresh process are not performed. As a result, a standby state for execution of the memory check process and the refresh process during access to the flash memory 14 is no longer present except in the case of immediately after power is supplied to the information processing apparatus 10. Therefore, a rapid access to the flash memory 14 can be performed constantly. Furthermore, since the memory check process and the refresh process are performed only immediately after power is supplied to the information processing apparatus 10, it becomes possible to prevent the memory from being deteriorated by frequent execution of these processes.

In the above-stated memory check process, memory check is performed only on one page in each of the blocks whenever power is supplied as illustrated in FIG. 3B for example. That is, when each block is constituted of K pages as illustrated in FIG. 3A, a series of memory check processes of all the pages of each block is completed when power is supplied K times. This makes it possible to reduce the starting time needed to enable normal access to the flash memory 14 after power is supplied, as compared with the case of performing memory check on all the pages in all the blocks after power on.

Second Embodiment

The configuration of respective units of an information processing apparatus according to a second embodiment is similar to that of the information processing apparatus 10 of the first embodiment. The information stored as page/block information 31 and the information stored as management information 40 are different from those in the information processing apparatus 10 of the first embodiment. Hereinafter, a description will mainly be given of the components and operations different from those in the first embodiment.

Figure 9A:
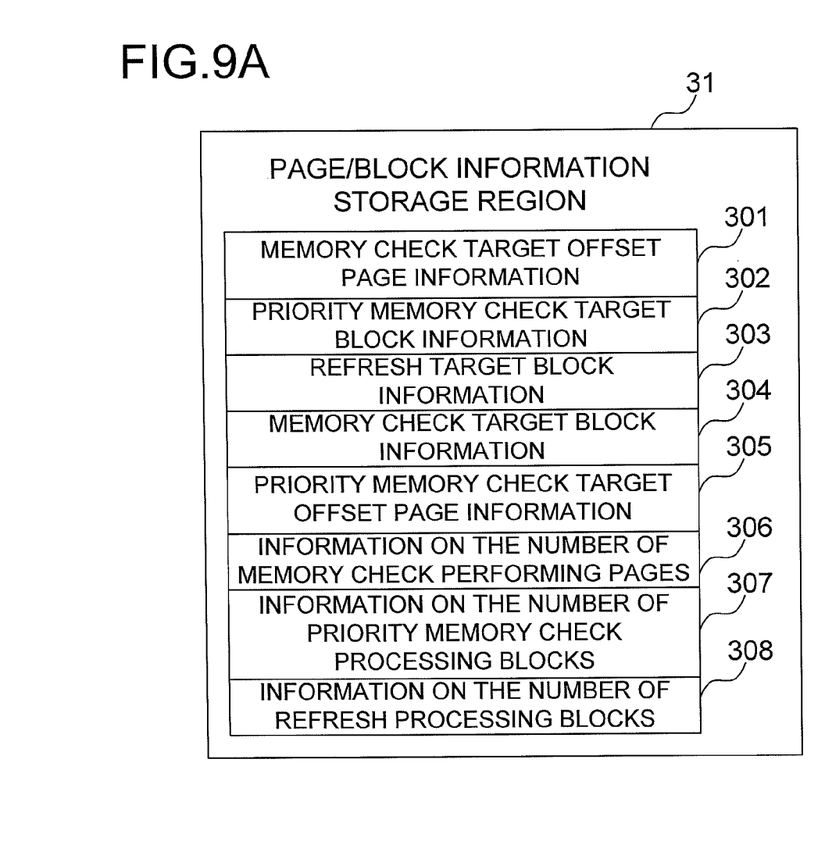
FIGS. 9A and 9B illustrate information included in the page/block information and the management information in a second embodiment of the present invention.

As illustrated in FIG. 9A, the page/block information 31 stored in the RAM 13 includes the information 301 to 305, as well as information on the number of memory check performing pages 306, information on the number of priority memory check processing blocks 307, and information on the number of refresh processing blocks 308.

Figure 9B:
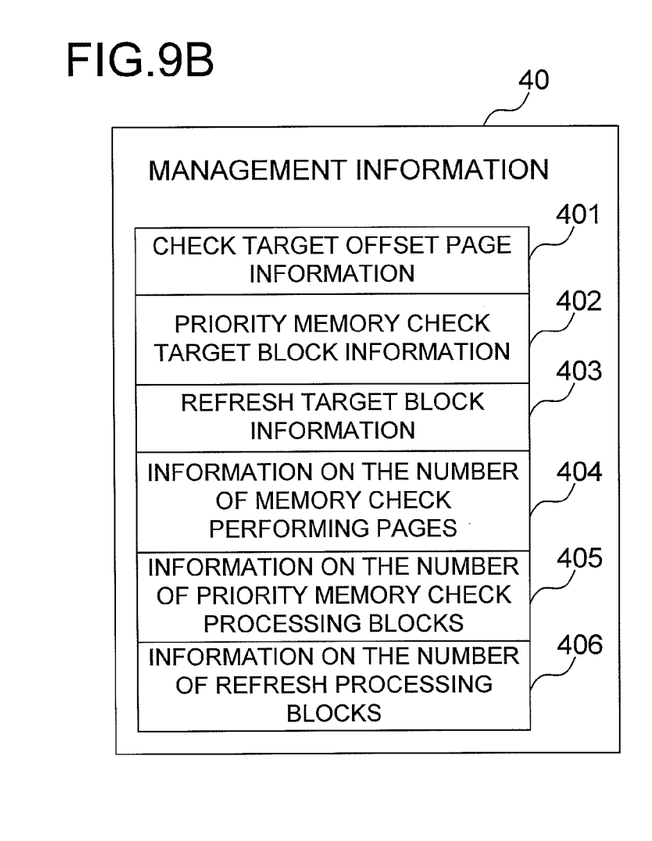

As illustrated in FIG. 9B, the management information 40 stored in the flash memory 14 includes the information 401 to 403, as well as information on the number of memory check performing pages 404, information on the number of priority memory check processing blocks 405, and information on the number of refresh processing blocks 406.

In step S3 of the memory check routine illustrated in FIG. 4, the CPU 11 reads the management information 40 from the flash memory 14, and writes the information to the RAM 13 as the page/block information 31. As a consequence, the information on the number of memory check performing pages 404 is stored in the RAM 13 as the information on the number of memory check performing pages 306. The information on the number of priority memory check processing blocks 405 is also stored in the RAM 13 as the information on the number of priority memory check processing blocks 307. Furthermore, the information on the number of refresh processing blocks 406 is stored in the RAM 13 as the information on the number of refresh processing blocks 308.

The information on the number of memory check performing pages 306 and 404 is information indicative of the number of pages in each block on which memory check is performed in one power on operation. On the basis of on the information on the number of memory check performing pages 306 in the RAM 13, the CPU 11 specifies addresses corresponding to the number of pages in each block in the flash memory 14, on which memory check is performed, and supplies a read command signal to the interface unit 12. In response to the read command signal, the interface unit 12 executes error detection process on encoded data pieces stored in the pages corresponding to the specified addresses.

The information on the number of priority memory check processing blocks 307 and 405 indicates a maximum number of blocks on which a priority memory check process is performed in one power on operation, when a plurality of blocks are stored as a priority memory check target block in the priority memory check target block information 302 and 402. On the basis of the information on the number of priority memory check processing blocks 307 in the RAM 13, the CPU 11 specifies addresses corresponding to the number of blocks within the range of the number of priority memory check target blocks, and supplies a read command signal to the interface unit 12. In response to the read command signal, the interface unit 12 executes an error detection process on the encoded data pieces stored in the blocks corresponding to the specified addresses.

The information on the number of refresh processing blocks 308 and 406 indicates a maximum number of blocks on which an error correction process is performed in one power on operation, if a plurality of blocks are stored as a refresh target block in the refresh target block information 303 and 403. On the basis of the information on the number of refresh processing blocks 308 in the RAM 13, the CPU 11 specifies addresses corresponding to the number of blocks within the range of the number of refresh processing blocks in the flash memory 14, and supplies a read command signal to the interface unit 12. In response to the read command signal, the interface unit 12 executes a refresh process on the encoded data pieces stored in the blocks corresponding to the specified addresses.

In the memory check process according to the above-stated second embodiment, the memory check is performed on the number of pages in each block, the number of pages being stored as the information on the number of memory check performing pages. Accordingly, when a value "2" is stored as the number of memory check performing pages, the memory check process is performed on two pages in each block whenever power is supplied to the information processing apparatus 10.

In the priority memory check process according to the second embodiment, the priority memory check is performed on the priority memory check target blocks, with the number of blocks stored as the information on the number of priority memory check processing blocks as a maximum block number. Accordingly, in the case where, for example, a value "5" is stored as the number of priority memory check processing blocks and seven blocks are stored as the priority memory check target blocks, the priority memory check is performed on five blocks in one power on operation, and the priority memory check for the remaining two blocks is performed in the next power on operation of the information processing apparatus 10.

In the refresh process according to the second embodiment, the refresh process is performed on refresh target blocks, with the number of blocks stored as the information on the number of refresh processing blocks as a maximum block number. Accordingly, in the case where, for example, a value "3" is stored as the number of refresh processing blocks and four blocks are stored as the refresh target blocks, the refresh process is performed on three blocks in one power on operation, and the refresh process for remaining one block is performed in the next power on operation of the information processing apparatus 10.

According to the information processing apparatus in the second embodiment, the number of memory check performing pages, the number of priority memory check processing blocks, and the number of refresh processing blocks are stored in advance in the flash memory. This makes it possible to control the range of the memory region targeted to the memory check process and the refresh process and to thereby facilitate adjustment of the time taken for the process in one power on operation.

As described in the foregoing, according to the present invention, the memory check process and the refresh process are performed only when a power-on reset signal is received. Accordingly, except for immediately after power is supplied to the information processing apparatus 10, the apparatus is free from the standby state for the memory check process and the refresh process. Therefore, a rapid access to the flash memory can be performed constantly.

According to the present invention, memory check is performed on a specified number of pages of each block whenever power is supplied to the information processing apparatus 10. This makes it possible to reduce the time needed to enable access to the flash memory after power is supplied, as compared with the case of performing memory check on all the pages in all the blocks after power on.

In the above embodiment, a one-byte value "Ox5A" is written to the power-on reset check region 30 upon reception of the reset signal R that is based on the power-on reset signal PR. Whether the received reset signal R is based on the power-on reset signal PR or not is determined on the basis of whether or not the power-on reset check region 30 holds the value "Ox5A." However, whether the received reset signal R is based on the power-on reset signal PR or not may be determined on the basis of whether or not a specified value is written to the power-on reset check region 30, and the specified value is not limited to the value "Ox5A." To prevent erroneous recognition, whether the received reset signal R is based on the power-on reset signal PR or not may be determined by writing not a one-byte value but a value of several bytes, for example.

In the above embodiment, the flash memory 14 stores the management information 40. However, a nonvolatile memory or the like, which is connected with the interface unit 12, may be provided separately from the flash memory, and the nonvolatile memory or the like may store the management information 40.

In the above embodiment, the memory check process has been described as a process for checking whether or not the data stored in the flash memory 14 is correctly read. In addition to this process, a process for checking whether or not the data can be written correctly may also be performed.

In the above embodiment, the memory check process is performed on one page or a specified number of memory check performing pages in all the blocks, whenever power is supplied to the information processing apparatus 10. However, it is also possible to store information, such as information on the number of memory check performing blocks that indicates the number of blocks on which the memory check is performed in one power on operation, and memory check progress information that indicates to which block the memory check has progressed, as the management information 40. With such information, the memory check process for all the blocks may be divided and performed in plural times. Such a configuration makes it possible to further reduce the time needed to enable access to the flash memory after power is supplied, as compared with the case where the memory check is performed on all the blocks.

What is claimed is:

1. A memory control device for controlling either write-in or read-out operation for a memory, the memory control device comprising:
   an interface unit connected to the memory for performing either write-in or read-out operation for the memory;
   a power-on reset signal generation unit for generating a power-on reset signal in response to power on of the memory control device;
   an internal reset signal generation unit for generating a an internal reset signal in response to a reset request;
   an initializing signal supply unit for delivering, to the interface unit, the power-on reset signal or the internal reset signal as an initializing signal that initializes write-in status or read-out status information data held by the interface unit; and
   a control unit for determining whether or not the initializing signal is based on the power-on reset signal after the write-in status or read-out status information data in the interface unit is initialized in response to the initializing signal, and for performing a check process on the memory if the initializing signal is determined to be based on the power-on reset signal,
   wherein the memory is divided into a plurality of blocks,
   the control unit performs the check process on some region of each of the blocks,
   the check process includes an error detection process that performs error detection on data read from the memory and generates information indicative of number of error bits, and
   the control unit executes an error correction process on a block, among the plurality of blocks, which includes data in which the number of error bits exceeds a specified threshold value.

2. The memory control device according to claim 1, further comprising a storage unit for storing a power-on reset code representative of completion of delivery of a first initializing signal which is the initializing signal delivered at first time after power on, and wherein
   the control unit determines whether or not the power-on reset code is stored in the storage unit in response to the initializing signal, and if the control unit determines that the power-on reset code is not stored, the control unit writes the power-on reset code to the storage unit and determines that the initializing signal is based on the power-on reset signal.

3. The memory control device according to claim 1, wherein
   the plurality of blocks are each divided into a plurality of pages, and
   whenever the power on is performed, the control unit changes a target page for the check process among the plurality of pages and performs the check process on the target page in each of the blocks.

4. The memory control device according to claim 1, wherein
the control unit executes the error correction process, if the reset signal is determined to be based on the power-on reset signal.

5. The memory control device according to claim 1, wherein
the control unit stores information indicative of number of the target pages for the check process and information indicative of maximum number of blocks, on which the error correction process is performed, as management information in the memory, and executes the check process and the error correction process on the basis of the management information.

6. A memory control method for controlling either write-in or read-out operation for a memory, the memory control method comprising the steps of:
receiving an initializing signal;
determining whether the initializing signal is a power-on reset signal generated in response to a power on or an internal reset signal generated in response to a reset request; and
performing a check process on the memory only when the initializing signal is determined to be based on the power-on reset signal,
wherein the memory is divided into a plurality of blocks, and
in the step of performing the check process, the check process is performed on some region of each of the blocks,
the check process includes an error detection process that performs error detection on data read from the memory and generates information indicative of number of error bits, and the method further includes the step of executing an error correction process on a block, among the plurality of blocks, which includes data in which the number of error bits exceeds a specified threshold value.

7. The memory control method according to claim 6, further comprising the step of storing a power-on reset code representative of completion of delivery of a first initializing signal which is the initializing signal delivered at first time after the power on, and wherein
in the step of performing the check process, it is determined whether or not the power-on reset code is stored in response to the initializing signal, and if it is determined that the power-on reset code is not stored, the power-on reset code is written and the initializing signal is determined to be based on the power-on reset signal.

8. The memory control method according to claim 6, wherein
the plurality of blocks are each divided into a plurality of pages, and
in the step of performing the check process, whenever the power on is performed, a target page for the check process is changed among the plurality of pages and the check process is performed on the target page in each of the blocks.

9. The memory control method according to claim 6, wherein the step of executing the error correction process includes the step of executing the error correction process if the reset signal is determined to be based on the power-on reset signal.

10. The memory control method according to claim 6, further comprising the step of storing information indicative of number of the target pages targeted to the check process and information indicative of maximum number of blocks, on which the error correction process is performed, as management information in the memory, and wherein
the step of executing the check process includes the step of executing the check process on the basis of the management information, and
the step of executing the error correction process includes the step of executing the error correction process on the basis of the management information.

* * * * *